United States Patent
Bryant

(10) Patent No.: US 6,188,112 B1
(45) Date of Patent: Feb. 13, 2001

(54) HIGH IMPEDANCE LOAD FOR INTEGRATED CIRCUIT DEVICES

(75) Inventor: Frank Randolph Bryant, Denton, TX (US)

(73) Assignee: STMicroelectronics, Inc., Carrollton, TX (US)

(*) Notice: Under 35 U.S.C. 154(b), the term of this patent shall be extended for 0 days.

(21) Appl. No.: 08/383,569

(22) Filed: Feb. 3, 1995

Related U.S. Application Data

(62) Division of application No. 08/085,973, filed on Jun. 30, 1993, now Pat. No. 5,416,034.

(51) Int. Cl.[7] .......................... H01L 29/76; H01L 29/94; H01L 31/062; H01L 31/113
(52) U.S. Cl. .................... 257/379; 257/384; 257/536; 257/537; 257/757; 257/761; 257/904
(58) Field of Search ..................... 257/382, 383, 257/384, 379, 530, 536, 537, 754, 757, 761, 903, 904

(56) References Cited

U.S. PATENT DOCUMENTS

| | | | |
|---|---|---|---|
| 4,337,476 | 6/1982 | Fraser et al. ........................ | 357/67 |
| 4,670,970 | 6/1987 | Bajor ...................................... | 29/584 |
| 4,710,897 | * 12/1987 | Masuoka et al. ..................... | 257/903 |
| 4,727,045 | * 2/1988 | Cheung et al. ....................... | 257/903 |
| 4,885,617 | * 12/1989 | Mazure-Espejo et al. .......... | 257/384 |
| 4,892,844 | 1/1990 | Cheung et al. ....................... | 437/194 |
| 4,951,112 | 8/1990 | Choi et al. ............................. | 357/41 |
| 5,070,038 | 12/1991 | Jin ........................................ | 437/700 |
| 5,182,619 | * 1/1993 | Pfiester .................................. | 257/382 |
| 5,321,306 | * 6/1994 | Choi et al. ............................ | 257/754 |
| 5,323,045 | * 6/1994 | Murai .................................... | 257/380 |
| 5,424,572 | * 6/1995 | Solheim ................................. | 257/370 |

* cited by examiner

Primary Examiner—Ngân Ngô
(74) Attorney, Agent, or Firm—Theodore E. Galanthay; Lisa K. Jorgenson; Dan Venglarik

(57) ABSTRACT

A high impedance load for an integrated circuit device provides an undoped, or lightly doped, layer of epitaxial silicon. The epitaxial silicon layer is formed over a conductive region in a substrate, such as a source/drain region. A highly conductive contact, such as a refractory metal silicide interconnect layer, is formed on top of the epitaxial silicon layer. Preferably, the epitaxial silicon layer is formed using solid phase epitaxy, from excess silicon in the silicide layer, by annealing the device after the silicide layer has been deposited.

24 Claims, 2 Drawing Sheets

HIGH IMPEDANCE LOAD FOR INTEGRATED CIRCUIT DEVICES

This is a Division, of application Ser. No. 08/085,973, filed Jun. 30, 1993, now U.S. Pat. No. 5,416,034.

BACKGROUND OF THE INVENTION

1. Field of the Invention

The present invention relates generally to integrated circuit devices, and more specifically to high impedance load devices.

2. Description of the Prior Art

CMOS static random access memory (SRAM) are increasingly used in the electronics industry due to their combination of speed, low power, and no requirements for refresh. A CMOS SRAM cell is built around a cross-coupled latch and accessed, typically, by two control gates for a standard SRAM cell. The basic SRAM cell may be formed using cross-coupled CMOS inverters, each having two n-channel and p-channel transistors. The p-channel transistors often are replaced with resistive loads. Typical loads presently used include a polycrystalline silicon resistor or a pn junction formed by two back-to-back polycrystalline silicon diodes. These types of resistive loads still take up large amounts of physical layout space.

With the desire to increase the density of integrated circuit devices on silicon, it would be desirable to decrease the physical layout space required by resistive loads such as polycrystalline silicon resistors and p-n junctions. Therefore, it would be desirable to provide a highly resistive polycrystalline resistive structure that requires less physical layout space than the presently used resistive load devices.

SUMMARY OF THE INVENTION

The present invention provides a method for fabricating a high impedance load device in an integrated circuit. An opening in an insulating layer is formed to expose a first region below the insulating layer. A layer of a refractory metal silicide is formed in the opening. The refractory metal silicide contains an excess of silicon. Then, the integrated circuit is annealed until a layer of epitaxial silicon from the refractory metal silicide is grown, called solid phase epitaxy (SPE), on the region, wherein the layer of epitaxial silicon separates the first region from the refractory metal silicide layer.

The method of the present invention may be used to create high impedance load devices in integrated circuit. For example the present invention may be use in a static random access memory (SRAM) in an integrated circuit. The SRAM includes a pass gate transistor; a pull-down transistor, wherein the pull-down transistor shares a source/drain region with the pass gate transistor; an insulating layer covering the two transistors; an opening in the insulating layer over the shared source/drain region; a region of a refractory metal silicide in the opening; and an epitaxial silicon layer deposited from the refractory metal silicide between the region of refractory metal silicide and the source/drain region, wherein the epitaxial silicon layer results from annealing the integrated device.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
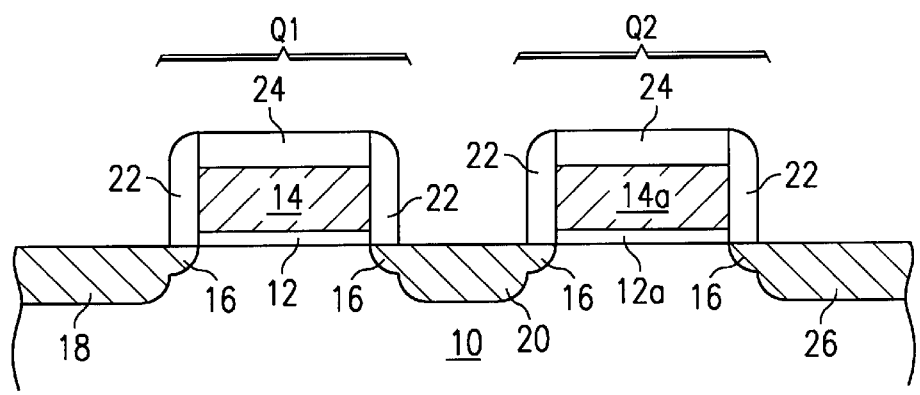
FIGS. 1–5 are cross-sectional views illustrating the fabrication of a high impedance load device in a p-type substrate.

Referring to FIG. 1, a cross section of a portion of a CMOS SRAM cell is shown as being fabricated in a p-type substrate 10. Transistor Q1 includes a thin gate oxide layer 12 and a polycrystalline silicon gate region 14. Polycrystalline silicon gate region 14 may be a doped polycrystalline silicon. Alternatively, a refractory metal silicide or a combination of layers of polycrystalline silicon and a refractory metal silicide may be used in this gate region. Transistor Q1 also includes lightly doped regions 16 and source/drain regions 18 and 20. The source/drain regions 18 and 20 are n-type active regions. Lightly doped drain (LDD) regions 16 are defined using side wall oxide spacers 22 as known in the art. Polycrystalline silicon gate region 14 is covered by oxide layer 24. Transistor Q2 includes a thin gate oxide region 12a and a polycrystalline silicon gate region 14a. Transistor Q2 includes lightly doped regions 20 and source/drain regions 20 and 26.

Figure 2:
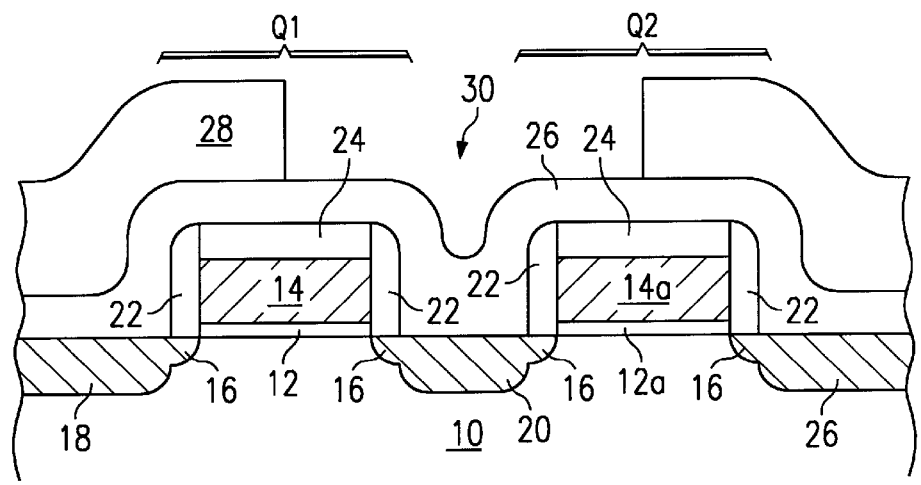

Referring next to FIG. 2, oxide layer 26 is deposited over the devices. Oxide layer 26 is an insulating layer. Afterward, a resist layer 28 is deposited over oxide layer 26 and then etched to define opening 30.

Figure 3:
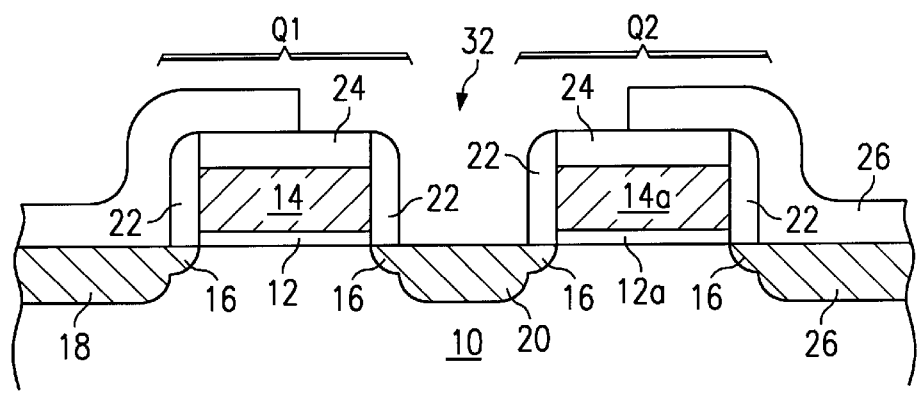

Referring next to FIG. 3, oxide layer 26 is patterned etched to define opening 32 and resist layer 28 is removed after defining opening 32. Opening 32 will be used to provide a VCC contact to a power supply voltage VCC and to the silicon substrate and/or any exposed polycrystalline silicon, source/drain region 20 and associated LDD 16. Design fabrication up to this stage uses conventional process steps well known in the art.

Figure 4:
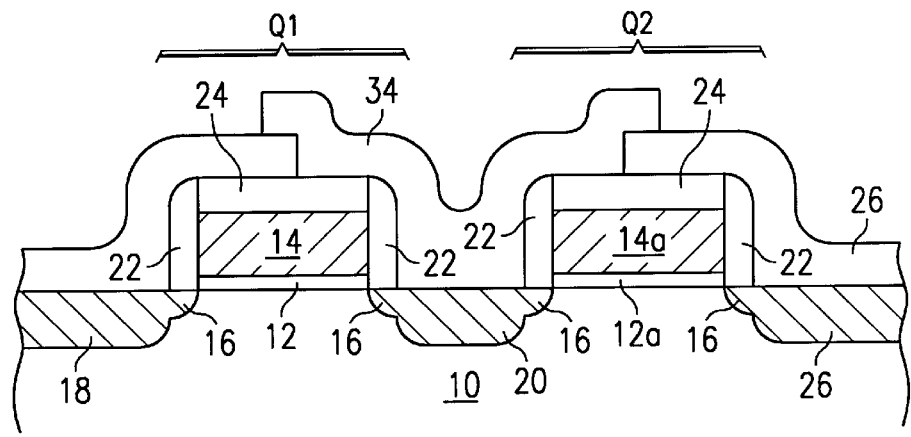

Referring now to FIG. 4, a plug 34 of tantalum silicide, $TaSi_2$, is deposited. Alternatively, a patterned tantalum silicide film may be used instead of plug 34. The tantalum silicide film may be used as a VCC line and not just as a contact plug in accordance with the preferred embodiment of the present invention. The tantalum silicide form a plug. Although the depicted embodiment illustrates the use of tantalum silicide, any refractory metal silicide may be used. The tantalum silicide deposited includes excess silicon. Excess tantalum silicide takes the form of $TaSi_x$, where x is from 2 to 5. A target having excess silicon may be used for sputtering or tantalum silicide may be deposited with polycrystalline silicon over tantalum silicide as a source for solid phase epitaxy (SPE).

Figure 5:
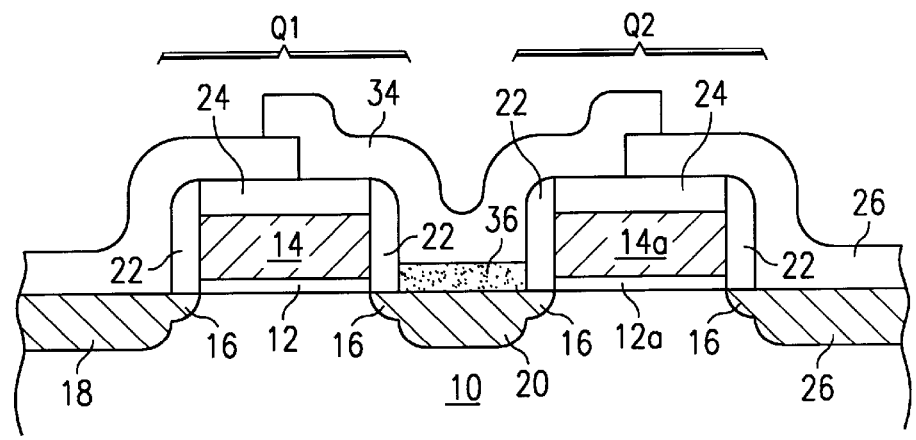

Turning now to FIG. 5, the device is annealed at a temperature of 200 degrees celcius to 850 degrees celcius for about 5 minutes to about 15 hours depending on the temperature. For a temperature of about 500 degrees celcius, an annealing time of about 2 to 5 hours is preferred to obtain a 0.3 µm layer of epitaxial silicon. As a result of annealing the device, undoped silicon will epitaxially deposit on the silicon surface from plug 34 to form an undoped epitaxial silicon region 36. The annealing should result in an absence of contact between the tantalum silicide and the source/drain region 20 and associated LDD 16. Thereafter, ion implantation is an option that may be used to adjust the resistive value of undoped epitaxial silicon region 36 if necessary. Since resistor implants are accomplished using very low doses, such an implantation may be used without masking the device. The resulting device is a high impedance load device that requires less space than the traditional methods of producing high impedance loads. As a result, the undoped epitaxial silicon region 28 provides a high impedance load device that requires less space than a highly doped polycrystalline silicon resistor or a pn junction created by two back-to-back silicon diodes.

Figure 6:
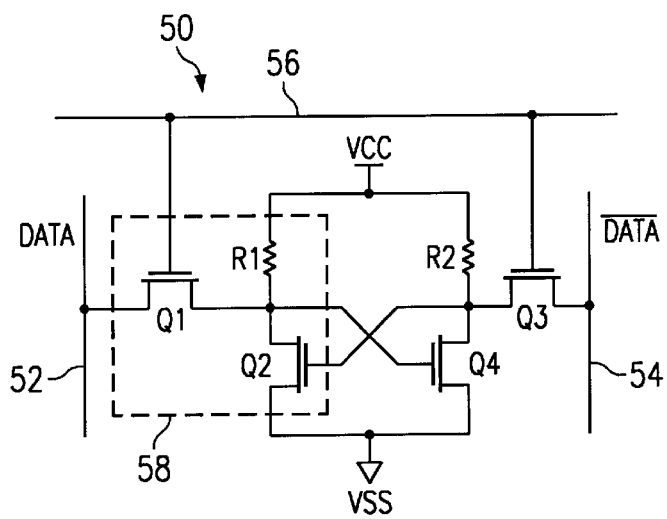
FIG. 6 is a schematic diagram of a 4-T SRAM cell in which a preferred embodiment of the present invention may be implemented.

With reference to FIG. 6, a schematic diagram is shown of a 4-T SRAM cell 50. SRAM cell 50 is constructed from transistors Q1–Q4 and resistors R1 and R2. The source/drain of transistor Q1 is connected to a true data line 52, while the source/drain of transistor Q3 is connected to a complement data line 54. The gates of transistors Q1 and Q3 are controlled by word line 56. A preferred embodiment of the present invention may be implemented in SRAM cell 50 within portion 58. Specifically, resistor R1 may be constructed according to the present invention to provide a high load impedance device that requires less space to construct than a typical polycrystalline silicon resistor or a pn junction.

Figure 7:
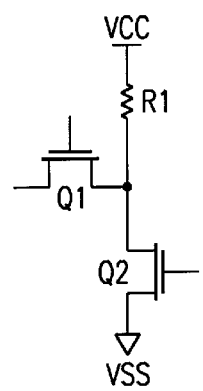
FIG. 7 is a schematic diagram of a portion of the 4-T SRAM cell in FIG. 6.

Referring now to FIG. 7, a schematic diagram of the portion 58 of the 4-T SRAM cell 58 with a high impedance load device is illustrated. Transistor Q1 has a gate attached to a word line and source/drain connected to a bit line and a second source/drain connected to the resistor R1 (formed by undoped epitaxial silicon region 28) and a source/drain of transistor Q2. Transistor Q2 is a pull-down transistor in the depicted embodiment. Resistor R1 is connected to power supply voltage VCC while a source/drain of transistor Q2 is connected to power supply voltage VSS. Power supply voltage VSS is typically at a lower voltage than power supply voltage VCC.

Using a preferred embodiment of the present invention, shorter contact lines may be used to connect devices to a power supply voltage than would be possible in the prior art. Thus, less physical layout space is required to create a high resistive load.

While the invention has been particularly shown and described with reference to a preferred embodiment, it will be understood by those skilled in the art that various changes in form and detail may be made therein without departing from the spirit and scope of the invention.

What is claimed is:

1. A high impedance load device in an integrated circuit comprising:
   an opening in an insulating layer exposing a first layer;
   a plug of a refractory metal silicide located in the opening; and
   a layer of very low conductivity epitaxial silicon separating the plug and the first layer to provide a high impedance region, wherein the epitaxial silicon results from annealing the integrated circuit.

2. The high impedance load device of claim 1, wherein the refractory metal silicide is tantalum silicide.

3. The high impedance load device of claim 2, wherein the layer of epitaxial silicon includes dopant atoms.

4. The high impedance load device of claim 3, wherein the dopant atoms in the layer of epitaxial silicon are placed into the layer of epitaxial silicon by ion implantation.

5. The high impedance load device of claim 4, wherein the integrated circuit is annealed at less than approximately 850 degrees celsius.

6. The high impedance load device of claim 5, wherein the integrated circuit is annealed at least approximately 200 degrees celsius.

7. The high impedance load device of claim 6, wherein the integrated circuit is annealed from about 5 minutes to about 15 hours.

8. The high impedance load device of claim 6, wherein the layer of epitaxial silicon includes dopant atoms.

9. The high impedance load device of claim 8, wherein the dopant atoms in the layer of epitaxial silicon are placed into the layer of epitaxial silicon by ion implantation.

10. The high impedance load device of claim 6, wherein the first region is an active region.

11. The high impedance load device of claim 10, wherein the active region is a source/drain region.

12. The high impedance load device of claim 11, wherein the refractory metal silicide is tantalum silicide.

13. The high impedance load device of claim 11, wherein the refractory metal silicide is aluminum silicide.

14. A static random access memory in an integrated circuit comprising:
   a pass gate transistor;
   a pull-down transistor, the pull-down transistor shares a source/drain region with the pass gate transistor;
   an insulating layer covering the two transistors;
   an opening in the insulating layer over the shared source/drain region;
   a region of a refractory metal silicide in the opening; and
   an epitaxial silicon layer deposited from the refractory metal silicide between the region of refractory metal silicide and the source/drain region, wherein the epitaxial silicon layer results from annealing the integrated device.

15. The static random access memory of claim 14, wherein the refractory metal silicide is tantalum silicide.

16. The static random access memory of claim 15, wherein the layer of epitaxial silicon includes dopant atoms.

17. The static random access memory of claim 16, wherein the dopant atoms are placed into the layer of epitaxial silicon by ion implantation.

18. The static random access memory of claim 17, wherein the integrated circuit is annealed at a temperature of less than approximately 850 degrees celsius.

19. The static random access memory of claim 18, wherein the integrated circuit is annealed at least approximately 200 degrees celsius.

20. The static random access memory of claim 19, wherein the layer of epitaxial silicon includes dopant atoms.

21. The static random access memory of claim 20, wherein the dopant atoms are placed into the layer of epitaxial silicon by ion implantation.

22. The static random access memory of claim 19, wherein the refractory metal silicide is tantalum silicide.

23. The method of claim 19, wherein the refractory metal silicide is aluminum silicide.

24. The high impedance load device of claim 1, wherein the layer of epitaxial silicon is undoped.

* * * * *